United States Patent [19]

Onishi et al.

[11] Patent Number: 4,975,416
[45] Date of Patent: Dec. 4, 1990

[54] METHOD OF PRODUCING SUPERCONDUCTING CERAMIC WIRE

[75] Inventors: Masashi Onishi; Takashi Kohgo; Tetsuya Ohsugi; Gotaro Tanaka, all of Yokohama, Japan

[73] Assignee: Sumitomo Electric Industries, Ltd., Osaka, Japan

[21] Appl. No.: 435,039

[22] Filed: Nov. 13, 1989

[30] Foreign Application Priority Data

Nov. 18, 1988 [JP] Japan ................. 63-292210
Oct. 4, 1989 [JP] Japan ................. 1-259828

[51] Int. Cl.$^5$ ............................. C03B 37/00
[52] U.S. Cl. ...................... 505/1; 505/733; 505/740; 505/742; 65/2; 65/33
[58] Field of Search .............. 65/2, 3.3, 33, 114; 505/704, 725, 733, 740, 739, 741, 742, 782, 785; 427/62, 63

[56] References Cited

U.S. PATENT DOCUMENTS

4,134,747  1/1979  Pierson et al. ................. 65/33
4,861,751  8/1989  Tenhover ........................ 427/62

FOREIGN PATENT DOCUMENTS

0285168  10/1988  European Pat. Off.
61-225808 10/1986  Japan.
64-674    1/1989  Japan ................. 505/740
1134819   5/1989  Japan ................. 505/740

OTHER PUBLICATIONS

Jin et al., High Tc Superconductors-Composite Wire Fabrication, Appl. Phys. Lett., Jul. 20, '87, pp. 203-204.
Zheng et al., $Bi_4Ca_3Sr_3Cu_4O_y$ Ceramic Fibers from Crystallization of Glasses, Appl. Phys. Lett., Sep. 18, '89, pp. 1255-1257.
Rojek et al., 115 K Superconductivity in Bi-Pb-(Ag,Nb,Sb)-Sr-Ca-Cu-O Systems, Solid State Communications, vol. 72, No. 1, Oct. '89.
Miura et al., As-Grown Crystallized Thin Film of Bi-Sr-Ca-Cu-O and its Low Temperature Annealing Effect, Appl. Phys. Lett., Apr. 10, '89, pp. 1474-1476.
Lee et al., Effect of Oxygen Partial Pressure on the Transformation Between High $T_c$ ..., Appl. Phys. Lett., Sep. 18, '89, pp. 1249-1251.
Tanaka et al., Composition Dependence at High $T_c$ Phase Formation in Pb Doped Bi-Sr-Ca-Cu-O Thin Films, Appl. Phys. Lett., Sep. 18, '89, pp. 1252-1254.
Skumryev et al., Physical Properties of $Bi,Ca,Cr,Cu_2O_x$ Superconductor Obtained by Rapid Quenching ..., Physica L 152 (1988), pp. 315-320.
Yurek et al., Direct Synthesis of a Metal/Superconducting Oxide Composite by Oxidation ..., Jour. Electrochem. Soc., vol. 134, No. 10, Oct. '87, pp. 2635-2636.
Bhargava et al., Crystallization of $Ba_2YCu_3O_x$ from Glasses in the System $BaO-Y_2O_3-CuO-B_2O_3$, Materials Research Society, Extended Abstracts, Apr. 5-9, '88, pp. 59-61.
Zheng et al., $Bi_4Sr_3Ca_3Cu_4O_{16}$ Glass and Superconducting Glass Ceramics, Physical Review B, vol. 38, No. 10, Oct. 1, '88, pp. 7166-7168.
Ramesh et al., Polytypoid Structure of Pb-Modified Bi-Ca-Sr-Cu-O Superconductor, Physical Review B, vol. 38, No. 10, Oct. 1, '88, pp. 7070-7073.
Jin et al., Fabrication of Dense $Ba_2YCu_3O_7\delta$ Superconductor Wire by Molten Oxide Processing, Appl. Phys. Lett., Sep. 28, '87, PTO: 8/13/87.

(List continued on next page.)

Primary Examiner—David L. Lacey
Assistant Examiner—John J. Bruckner
Attorney, Agent, or Firm—Stevens, Davis, Miller & Mosher

[57] ABSTRACT

A superconducting ceramic wire is prepared from a superconducting ceramic-forming oxide composition by melting, the composition and quenching the melt to form a dense glass, which is soften and wire-drawn in a furnace. The resulting wire is heat-treated to form crystals and made into a superconducting ceramic wire. The wire has a flexibility and remarkable superconductivity which can further be improved by applying pressure to be made more dense and repeating the heat-treatment.

23 Claims, 2 Drawing Sheets

OTHER PUBLICATIONS

Jin et al., Superconductivity in the Bi-Sr-Ca-Cu-O Compounds with Noble Metal Additions, Appl. Phys. Lett., May 9, '88, pp. 1628-1630.

Jpn. J. Appl. Phys. Letter, 52(19), May 9, 1988.

"High $T_c$ Superconducting Glass Ceramics Based on the Bi-Ca-Sr-Cu-O System", IEEE Transactions on Magnetics, vol. 25, No. 2, Mar. 1989, pp. 2150-2153, IEEE, New York, U.S. & Applied Superconductivity Conference, Aug. 21, 88, San Francisco, U.S.; T. Komatsu et al.

"Preparation of High-$T_c$ Superconducting bi-Pb-Sr-Ca-Cu-O Ceramics by the Melt Quenching Method", Japanese Journal of Applied Physics, vol. 27, No. 12, Dec. 1988, pp. L2293-L2295, Tokyo, JP; T. Komatsu et al.

METHOD OF PRODUCING SUPERCONDUCTING CERAMIC WIRE

BACKGROUND OF THE INVENTION 1. (Field of the Invention)

The present invention relates to a method of producing superconducting ceramic wire. More particularly, it relates to a method of producing a superconducting ceramic wire from metallic oxide glass material obtained by melt-quenching a metal oxideforming chemical composition capable of being converted into a superconducting ceramic.

2. (Description of the Prior Art)

The production of superconducting ceramic wire has been thought very difficult due to the brittleness of the material. Hitherto, the wire is barely produced by so-called "noble metal-sheathed drawing method" in which a superconducting oxides composition is preliminarily sintered, packed in a noble metal sheath or pipe such as silver in a fine pulverized form, and the pipe is subjected to cold working to form a drawn wire of the sintered material, followed by heat treatment to give a superconducting wire. In this method, the pipe may, if possible, be removed by dissolving with chemicals.

According to the above method, the use of the noble metal pipe is not only costly but also restricts the length of the resulting wire. Further, the continuity of the sintered powder is liable to break during the cold working, making wire-working difficult and causing poor flexibility of the resulting wire. Further more, the cover of the noble metal is liable to make insufficient the supply of oxygen during the heat treatment, which has an important role in preparing superconductive ceramics.

SUMMARY OF THE INVENTION

An extensive effort has been made to resolve the above problem of the prior art, and this invention has been achieved.

The present invention is directly primarily to a method of producing superconducting ceramic wire which comprises the steps, (a) homogeneously melting a metallic oxide-forming chemical composition capable of being converted into a superconducting ceramic and quenching the melt to form a glass, (b) wire-drawing the glass and (c) conducting a heat treatment of the drawn glass to make it superconducting wire.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

Figure 1:
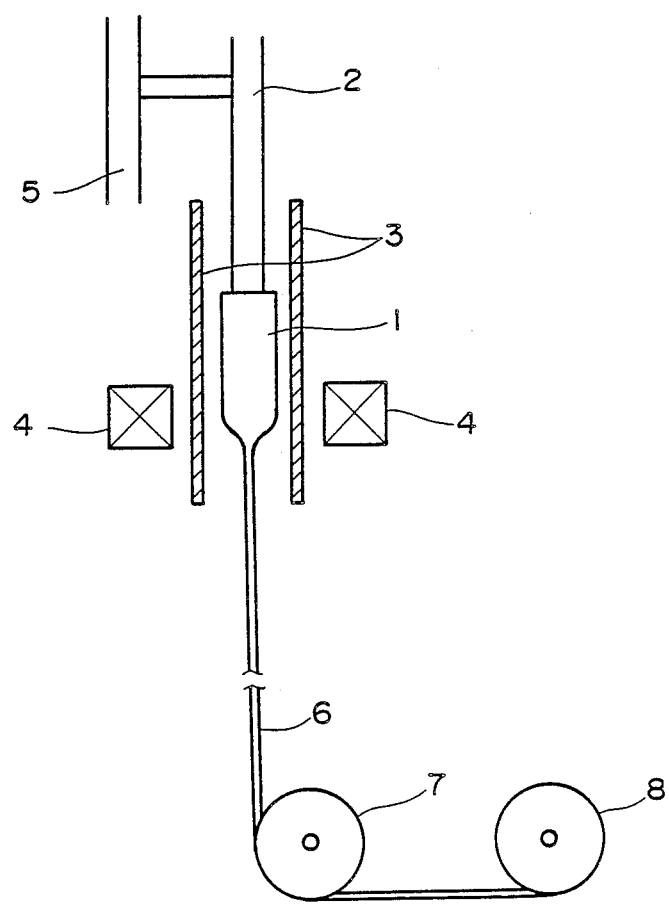
FIG. 1 is a sectionally elevation view of a wire-drawing apparatus as a schematically illustrated working system, for explaining the present invention.

A number of superconducting oxide system for example, Ta-system etc. are known, and the present process will be applicable thereto. However, the present invention will concretely be explained by referring to the production of a wire of Bi-Sr-Ca-Cu-O system (hereinafter referred to as system A) and Bi-Pb-Sr-Ca-Cu-O system (hereinafter referred to as system B) in which a part of Bi in system A is replaced with Pb.

The metallic oxide-forming chemical composition capable of being converted into a superconducting ceramic usable in the present invention may be any chemical compounds bearing oxygen atom or mixture thereof as far as it becomes superconductive when converted into a ceramic and subjected to superconducting treatment. The chemical compounds and proportion thereof in the composition are accorded with resulting superconducting oxide system. Thus not limitative example of the composition used in the above exemplified system A and B includes a mixture selected in desired combination from $Bi_2O_3$, PbO, $SrCO_3$, $CaCO_3$ and CuO. The preferable mol. ratio of the chemical compounds is, for example, $2(BiO_{1.5}-PbO):2(SrCO_3):2(CaCO_3): 3(CuO)$ for system A and $1.6(BiO_{1.5}):0.4(PbO):2(SrCO_3): 2(CaCO_3):3(CuO)$ for system B, and the ratio is maintained as atomic weight of the metals in the resulting superconducting system. According to the present invention, the system B is preferably used and Bi may be replaced in an atomic weight of up to 35%, and preferably in a range of from 10 to 35%, with Pb.

The chemical composition is molten in a crucible by heating at a temperature higher than the melting point of the composition. The crucible used is of refractory materials such as alumina, magnesia and other metal oxides and combination thereof or of noble metals such as platinum, gold and a heat-resistant alloy thereof. Among them, alumina crucible is preferable. The temperature used is preferably not more than 400° C. plus melting point of the composition to prevent evaporation of the essential ingredient having a comparatively high vapor pressure and fusing-out of the crucible material or component thereof.

In the preparation of the above exemplified superconducting oxide systems, the temperature is preferably 1150°±100° C. The melting process is continued until the chemical composition decomposes and homogeneous melt is obtained. In case of the above systems, the time is enough within 1 hour. If the chemical composition contains a carbonate, it may preliminary be calcined at about 800° C. to remove carbon.

Thus prepared melt is quenched to form a glass. The quenching is simply carried out by pouring the melt on a metal plate such as iron plate at room temperature so as to form a glass which is suitable for use in the next wire-drawing step. The glass may, if possible, be made by pressing the poured melt between two metal plates.

The glass, preferably cut into a form of rod or plate, is wire-drawn to obtain a glass wire having a desired dimension. The step will be explained by referring to the attached drawings.

As shown in FIG. 1, the glass 1 is fixed downwards to an end of dummy rod 2 and inserted in a quartz pipe 3 provided around with a heater 4, when the rod 2 is put down by a transfer means 5, the glass 1 fixed to the rod 2 is heated by the heater 4 to soften, whereby commencing wire-drawing. A drawn wire 6 is wound up on a winding means 8 via a capstan 7. Though the temperature used may be different depending upon respective oxide system, it is desirable to be a temperature corresponding to a viscosity of the soften glass ranging from 106 to 104 poises, which will decide the dimension of the drawn wire in a form of desired shape, for example thin tape.

Next, the drawn glass wire is subjected to a heat-treatment to make superconductive, that is, to recrystallize. The step is conducted under the following condition. The glass wire is kept at a crystal nucleus-forming temperature or a temperature making the rate of formation of crystal nucleus maximum (hereinafter referred to as 1st stage heating) for more than 1 hour, and then at a crystal-growing temperature or a temperature making the rate of growth of crystal maximum (hereinafter referred to 2nd stage heating) for more than 20 hour. In the exemplified systems A and B, the 1st stage heating temperature is one corresponding to a viscosity of the glass ranging from 1011 to 1012 poises, and about 420° C. to about 430° C.

On the other hand, though the 2nd stage heating temperature is different depending on the composition of the system, it may be generally be 800° C. to 870° C. The 1st stage heating may be omitted, and the glass wire may undergo only the 2nd stage heat-treatment. Also, these heat treatments may be conducted in an atmosphere of the saturated vapor of the essential atom baring oxygen atom such as PbO. Further, silver (Ag) acting as nucleus-forming adjuvant and having no influence in the superconductivity (Jpn. J. Appl. Phys. Letter, 52(19), 9 May 1988) may be added to the starting chemical composition to accelerate the formation of crystal nucleus occurring in this stage.

To the method of the present invention, is further added the following step(s) containing, alone or in combination, covering with a metal such as silver, applying pressure to, and/or subjecting to the heat-treatment at 800° C. to 870° C., the resulting superconducting ceramic wire in order to enhance its property.

The cover of the metal is provided around whole surface of the ceramic wire by any way such as insertion in a pipe of the metal, dipping into a molten bath of the metal and covering with tape(s) of the metal.

Figure 2:
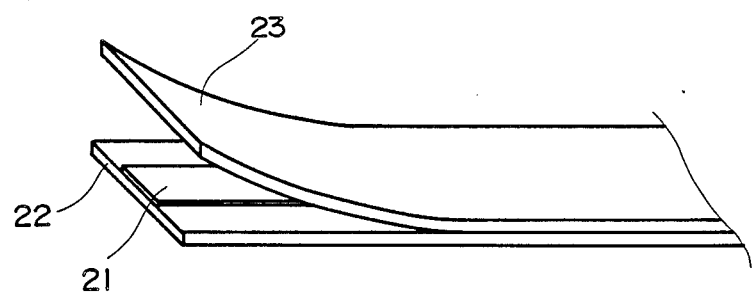
FIG. 2 is a perspective view of an assembly of a metal cover and a wire to be pressed.

The pressing is conducted by applying preferably about 1000 kg/cm2 to the drawn superconducting wire with or without the metal covered by rolling mill or other pressing machines. FIG. 2 shows as an example, a wire 21 sandwiched between two silver foils 22 and 23 to be pressed towards right angular direction against plain. The pressing effects to increase the crystal cleavage of the wire.

The heat-treatment is again carried out here with respect to the superconducting wire with or without being subjected to the above other treatments. This is carried out according to the 2nd stage heating. The combination of the pressing and the heat-treatment is preferable and carried out by such a way that heat-treatment is effected with respect to a wire, having been pressed, on the way of pressing, or during pressing. Such treatment in combination may be repeated several times, and enables to enhance significantly Jc of the resultant superconducting ceramic wire.

According to the present invention, the drawbacks of the prior art can be obviated. That is, the melting-quenching step enables to make a long glass wire having continuity, desired dimension, for example desired thickness, good flexibilty and processability. The heat-treatment is carried out in an atmosphere where oxygen can freely go in and out, and hence prevents insufficiency of oxygen atom in the resulting superconducting ceramics. Also, the heat-treatment enables to obtain a high density ceramic wire having a high Jc due to the use of an oxide glass which is amorphous and has a substantially theoretical density as compared with the use of a sintered oxide of the prior art. The superconducting ceramic wire obtained according to the present invention is being expected to be applied to transfer cable or magnet.

The invention will explained in more detail by way of referring to the following Examples.

EXAMPLE 1

A chemical composition was prepared by homogeneously mixing $Bi_2O_3$, PbO, $SrCO_3$, $CaCO_3$ and CuO in a pulverized form so that the atomic weight ratio becomes Bi:Pb:Sr:Ca:Cu=1.6:0.4:2:2:3. The composition was molten at a temperature of 1150° C. for 40 minuets in an alumina crucible. The resulting homogeneous melt was poured onto an iron plate, covered by another iron plate, and pressed into a glass plate having a thickness of 2 mm. The glass plate was cut into a dimension of 5 cm in width and 7 cm in length, fixed longitudinally onto an end of a dummy rod in a wire-drawing apparatus shown in FIG. 1. The glass plate was wire-drawn at a temperature of 435° C. of the heater in the apparatus to obtain a tape wire having 1.5 mm width, 100 μm thickness and 10 m length, which has such a superior flexibility that it can be wound onto a mandrel of 10 mm diameter.

The wire was placed in a heat-treating furnace, heat-treated by the 1st stage heating at 430° C. for 4 hours and then by 2nd stage heating at 820° C. for 60 hours.

Thus obtained superconducting ceramic wire had a superconducting property of the critical temperature Tc(R=0)=86° K. and the critical current density Jc=100 A/cm2 (at 77° K. in the zero magnetic field) as determined by the conventional four-point probe method.

EXAMPLE 2

Example 1 was repeated, provided that the 1st stage heating was effected at a 423° C. for 4 hours and the 2nd stage heating was at 860° C. for 100 hours.

The wire obtained had 1.5 mm width, 100 μm thickness and 10 m length, which has such a superior flexibility that it can be wound onto a mandrel of 10 mm diameter, and a property of TC(R=0)=101° K. and Jc=100A/cm$^2$ (77° K., zero magnetic field).

EXAMPLE 3

Example 1 was repeated, provided that a chemical composition was prepared by adding $Ag_2O$ to the chemical composition of Example 1 in an amount of 20% by weight thereof. The same procedure was repeated twice, and two ceramic wires (A and B), both having 1.5 mm width, 100 μm thickness and 10 m, were obtained.

Further the wires had such superior flexibility that it can be wound onto a mandrel of 10 mm diameter.

The superconducting property was determined and shown below:

Wire A:Tc(R=0)=87° K., Jc=250 A/cm2 (77° K., zero magnetic field)

Wire B: Tc(R=0)=102° K., Jc=250 A/cm2 (77° K., zero magnetic field)

The enhancement of critical current density, Jc, as compared with that of the wire obtained in Example 1, is thought to be resulted from the addition of Ag which will accelerate crystal formation and make the ceramic tissue more dense.

EXAMPLE 4

Example 1 was repeated, provided that the 1st stage heating was omitted and the 2nd stage heating was effected by such a way that the tape wire was heated directly from a room temperature to 820° C. and at this temperature for 60 hours in the heating apparatus.

The property concerned of the thus obtained wire is as follows: Tc(R=0)=40° K., Jc=10 A/cm2 (4.2° K., zero magnetic field)

The property is inferior as compared with those of wire obtained in Examples 1 and 2, but almost sufficient superconductivity is obtained.

EXAMPLE 5

Example 4 was repeated, provided that the temperature and time of the 2nd stage heating were 860° C. and 100 hours.

The property concerned of the thus obtained wire is as follows: Tc(R=0)=80° K., Jc=10 A/cm2 (77° K., zero magnetic field).

EXAMPLE 6

The superconducting ceramic wire obtained according to Example 1 was sandwiched between two silver foils of 3 mm width and 300 μm thickness and applied a pressure of 20 ton/cm2 (as shown in FIG. 2). Then the wire was heat-treated at 850° C. for 50 hours. The combination of the pressing and heat-treatment was repeated once more.

The critical current density of the thus obtained wire is as high as 3500 A/cm2 at 77° K., in the zero magnetic field.

EXAMPLE 7

Example 1 was repeated, provided that the chemical composition was previously calcined at 800° C. for 10 hours, pulverized and well mixed, that the melting time was 20 minuets and that the second heating was effected at 860° C. for 240 hours.

The property concerned of the thus obtained wire is as follows: Tc(R=0)=68° K., Jc=51 A/cm2 (4.2° K., zero magnetic filed).

EXAMPLE 8

Example 1 was repeated, provided that the melting temperature was 1300° C.

The property concerned of the thus obtained wire is as follows: Tc(R=0)=28° K., Jc=2 A/cm2 (4.2° K.).

The inferior property as compared with that of the wire obtained in Example 1 is probably resulted from an alteration of the system of a contamination of the crucible component due to the high melting temperature.

EXAMPLE 9

Example 1 was repeated, provided that the chemical composition was prepared by mixing homogeneously $Bi_2O_3$, $SrCO_3$, $CaCO_3$ and $CuO$ in a pulverized form so that the atomic weight ratio becomes Bi:Sr:Ca:Cu=2:2:2:3.

The property concerned of the thus obtained wire is as follows: Tc(R=0)=32° K., Jc=1 A/cm2 (at 4.2° K.).

EXAMPLE 10

The superconducting ceramic wire obtained in Example 1 was heat-treated at 423° C. for 4 hours (1st stage heating) and then at 840° C. for 100 hours (2nd stage heating) in an atmosphere of saturated PbO vapor.

The property concerned of the thus obtained wire is as follows: Tc(R=0)=107° K., Jc=200 A/cm2 (77° K., zero magnetic field).

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A method of producing a superconducting ceramic wire of a Bi-Sr-Ca-Cu-O system which comprises the steps:
   (a) homogeneously melting a mixture consisting essentially of oxygen-bearing Bi, Sr, Ca and Cu compounds capable of being converted into a superconducting ceramic and silver in an amount sufficient for accelerating the formation of superconductive crystal nuclei of said system and quenching the melt to form a glass,
   (b) wire-drawing the glass, and
   (c) conducting a heat-treatment of the drawn glass to effect recrystallization thereof.

2. A method of producing a superconducting ceramic wire according to claim 1, wherein said method further comprises the steps:
   (d) applying pressure to the recrystallized drawn glass in step (c) with or without a metal cover to cause crystal cleavage, and
   (e) conducting further heat-treatment of the crystal-cleaved drawn glass to further recrystallize it, the further heat-treatment being conducted before, during or after the application of pressure in step (d).

3. A method of producing a superconducting ceramic wire according to claim 2, wherein steps (d) and (e) are repeated several times.

4. A method of producing a superconducting ceramic wire according to claim 1, wherein the system contains the metals in an atomic weight ratio of Bi:Sr:Ca:Cu=2:2:2:3.

5. A method of producing a superconducting ceramic wire according to claim 1, wherein said melting is carried out at 1150°±100° C.

6. A method of producing a superconducting ceramic wire according to claim 1, wherein the quenching is conducted by pouring the glass onto a metal plate.

7. A method of producing a superconducting ceramic wire according to claim 1, wherein said wire-drawing is effected at a temperature corresponding to a viscosity of $10^6$–$10^4$ poises of the drawn glass.

8. A method of producing a superconducting ceramic wire according to claim 7, wherein said temperature is 450°±50° C.

9. A method of producing a superconducting ceramic wire according to claim 1, wherein said heat-treatment is conducted at a temperature of 420° to 430° C. to form crystal nuclei and then at 800° to 870° C. to effect recrystallization growth.

10. A method of producing a superconducting ceramic wire according to claim 1, wherein said heat-treatment is conducted at a temperature of 800° to 870° C.

11. A method of producing a superconducting ceramic wire according to claim 1, wherein the mixture, contains a metal carbonate, and is calcined at about 800° C. so as to remove the resulting carbon therefrom.

12. A method of producing a superconducting ceramic wire of a (Bi plus Pb)-Sr-Ca-Cu-O system in which Pb is present in an atomic weight of up to 35% of (Bi plus Pb); which comprises the steps:

(a) homogeneously melting a mixture consisting essentially of oxygen-bearing Bi, Sr, Ca, Cu and Pb compounds capable of being converted into a superconducting ceramic and silver in an amount sufficient for accelerating the formation of superconductive crystal nuclei of said system and quenching the melt to form a glass, (b) wire-drawing the glass, and (c) conducting a heat-treatment of the drawn glass to effect recrystallization thereof.

13. A method of producing a superconducting ceramic wire according to claim 12, wherein said method further comprises the steps:

(d) applying pressure to the recrystallized drawn glass in step (c) with or without a metal cover to cause crystal cleavage, and (e) conducting further heat-treatment of the crystal-cleaved drawn glass to further recrystallize it, the further heat-treatment being conducted before, during or after the application of pressure in step (d).

14. A method of producing a superconducting ceramic wire according to claim 12, wherein steps (d) and (e) are repeated several times.

15. A method of producing a superconducting ceramic wire according to claim 12, wherein the system contains the metals in an atomic weight ratio of (Bi plus Pb):Sr:Ca:Cu=2:2:2:3.

16. A method of producing a superconducting ceramic wire according to claim 12, wherein said melting is carried out at 1150°±100° C.

17. A method of producing a superconducting ceramic wire according to claim 12, wherein the quenching is conducted by pouring the glass onto a metal plate.

18. A method of producing a superconducting ceramic wire according to claim 12, wherein said wire-drawing is effected at a temperature corresponding to a viscosity of $10^6$-$10^4$ poises of the drawn glass.

19. A method of producing a superconducting ceramic wire according to claim 18, wherein said temperature is 450°±50° C.

20. A method of producing a superconducting ceramic wire according to claim 12, wherein said heat-treatment is conducted at a temperature of 420° to 430° C. to form crystal nuclei and then at 800° to 870° C. to effect recrystallization growth.

21. A method of producing a superconducting ceramic wire according to claim 12, wherein said heat-treatment is conducted at a temperature of 800° to 870° C.

22. A method of producing a superconducting ceramic wire according to claim 12, wherein the mixture, contains a metal carbonate, and is calcined at about 800° C. so as to remove the resulting carbon therefrom.

23. A method of producing a superconducting ceramic wire according to claim 12, wherein Pb is present in said system in an amount from 10 to 35% of (Bi plus Pb).

* * * * *

UNITED STATES PATENT AND TRADEMARK OFFICE
CERTIFICATE OF CORRECTION

PATENT NO. : 4,975,416

DATED : December 4, 1990

INVENTOR(S) : Masashi ONISHI et al.

It is certified that error appears in the above-identified patent and that said Letters Patent is hereby corrected as shown below:

Column 3, line 7, change "106 to 104" to --$10^6$ to $10^4$--; and line 22, change "1011 to 1012" to --$10^{11}$ to $10^{12}$--.

Signed and Sealed this

Sixteenth Day of June, 1992

Attest:

DOUGLAS B. COMER

*Attesting Officer*   *Acting Commissioner of Patents and Trademarks*